United States Patent
Shtargot et al.

(10) Patent No.: US 11,955,437 B2
(45) Date of Patent: Apr. 9, 2024

(54) REGULATOR CIRCUIT PACKAGE TECHNIQUES

(71) Applicant: Analog Devices International Unlimited Company, Limerick (IE)

(72) Inventors: Leonard Shtargot, Campbell, CA (US); Zafer Kutlu, Menlo Park, CA (US); John Underhill Gardner, San Jose, CA (US)

(73) Assignee: Analog Devices International Unlimited Company, Limerick (IE)

( * ) Notice: Subject to any disclaimer, the term of this patent is extended or adjusted under 35 U.S.C. 154(b) by 273 days.

(21) Appl. No.: 17/313,845

(22) Filed: May 6, 2021

(65) Prior Publication Data
US 2021/0257313 A1 Aug. 19, 2021

Related U.S. Application Data

(62) Division of application No. 16/193,843, filed on Nov. 16, 2018, now Pat. No. 11,037,883.

(51) Int. Cl.
*H01L 23/552* (2006.01)
*H01L 21/3205* (2006.01)
(Continued)

(52) U.S. Cl.
CPC ...... *H01L 23/552* (2013.01); *H01L 21/32051* (2013.01); *H01L 21/561* (2013.01); *H01L 21/78* (2013.01); *H01L 23/3121* (2013.01); *H01L 23/367* (2013.01); *H01L 23/5383* (2013.01); *H01L 24/16* (2013.01); *H01L 24/81* (2013.01); *H01L 24/97* (2013.01); *H01L 25/16* (2013.01); *H01L 27/0207* (2013.01); *H01L 27/0617* (2013.01); *H01L 2224/16227* (2013.01); *H01L 2924/01022* (2013.01);
(Continued)

(58) Field of Classification Search
CPC ..... H01L 23/552; H01L 21/561; H01L 21/78; H01L 23/3121; H01L 24/16; H01L 24/81; H01L 24/97; H01L 27/0207; H01L 2224/16227
USPC ........................................ 257/659
See application file for complete search history.

(56) References Cited

U.S. PATENT DOCUMENTS 7,618,846 B1 * 11/2009 Pagaila .................. H01L 24/19
257/E21.599
7,973,633 B2 7/2011 Noma et al.
(Continued)

FOREIGN PATENT DOCUMENTS

CN 106464137 A 2/2017
CN 107026107 A 8/2017
(Continued)

OTHER PUBLICATIONS

"U.S. Appl. No. 16/193,843, Final Office Action dated Oct. 27, 2020", 11 pgs.
(Continued)

*Primary Examiner* — Jami Valentine Miller
(74) *Attorney, Agent, or Firm* — Schwegman Lundberg & Woessner, P.A.

(57) ABSTRACT

Techniques are provided for containing magnetic fields generated by an integrated switching package and for reducing electromagnetic interference generated from an integrated switching package.

19 Claims, 7 Drawing Sheets

(51) Int. Cl.
 *H01L 21/56*   (2006.01)
 *H01L 21/78*   (2006.01)
 *H01L 23/00*   (2006.01)
 *H01L 23/31*   (2006.01)
 *H01L 23/367*   (2006.01)
 *H01L 23/538*   (2006.01)
 *H01L 25/16*   (2023.01)
 *H01L 27/02*   (2006.01)
 *H01L 27/06*   (2006.01)
 *H02M 1/08*   (2006.01)

(52) U.S. Cl.
 CPC .............. *H01L 2924/1431* (2013.01); *H01L 2924/19041* (2013.01); *H01L 2924/19105* (2013.01); *H01L 2924/3025* (2013.01); *H02M 1/08* (2013.01)

(56) References Cited

U.S. PATENT DOCUMENTS

| | | | |
|---|---|---|---|
| 8,823,345 B2 | 9/2014 | Shtargot et al. | |
| 10,027,228 B2* | 7/2018 | Sasao | H02M 3/158 |
| 2009/0160595 A1* | 6/2009 | Feng | H01L 23/49861 |
| | | | 336/200 |
| 2009/0302437 A1* | 12/2009 | Kim | H01L 21/561 |
| | | | 257/E23.18 |
| 2010/0038735 A1 | 2/2010 | Li et al. | |
| 2010/0052096 A1 | 3/2010 | Urakawa | |
| 2011/0128074 A1 | 6/2011 | Nakano | |
| 2012/0320581 A1* | 12/2012 | Rogers | F21V 29/70 |
| | | | 257/E33.059 |
| 2014/0055117 A1* | 2/2014 | Elwan | H02M 3/156 |
| | | | 323/311 |
| 2014/0070423 A1* | 3/2014 | Woychik | H01L 21/4857 |
| | | | 257/774 |
| 2014/0239464 A1 | 8/2014 | Chung et al. | |
| 2014/0353807 A1 | 12/2014 | Welch et al. | |
| 2016/0027740 A1 | 1/2016 | Chiu et al. | |
| 2017/0093285 A1 | 3/2017 | Sasao | |
| 2020/0161253 A1* | 5/2020 | Shtargot | H01L 27/0617 |
| 2020/0212012 A1* | 7/2020 | Meyers | H01L 21/561 |
| 2020/0328144 A1* | 10/2020 | Fan | H01L 21/56 |

FOREIGN PATENT DOCUMENTS

| | | |
|---|---|---|
| CN | 111199965 A | 5/2020 |
| DE | 102019007881 A1 | 5/2020 |
| JP | 2012228052 A | 11/2012 |
| TW | 201839929 A | 11/2018 |
| TW | 202109686 A | 3/2021 |

OTHER PUBLICATIONS

"U.S. Appl. No. 16/193,843, Non Final Office Action dated Apr. 29, 2020", 8 pgs.

"U.S. Appl. No. 16/193,843, Notice of Allowance dated Feb. 10, 2021", 8 pgs.

"U.S. Appl. No. 16/193,843, Response filed Jan. 26, 2021 to Final Office Action dated Oct. 27, 2020".

"U.S. Appl. No. 16/193,843, Response filed Mar. 6, 2020 to Restriction Requirement dated Jan. 7, 2020", 7 pgs.

"U.S. Appl. No. 16/193,843, Response filed Jul. 29, 2020 to Non Final Office Action dated Apr. 29, 2020", 6 pgs.

"U.S. Appl. No. 16/193,843, Restriction Requirement dated Jan. 7, 2020", 7 pgs.

"Chinese Application Serial No. 201911090247.6, Office Action dated Jan. 13, 2023", w/o English Translation, 8 pgs.

"Chinese Application Serial No. 201911090247.6, Response filed May 27, 2023 to Office Action dated Jan. 13, 2023", w/ English Claims, 12 pgs.

"Taiwanese Application Serial No. 108140978, Office Action dated Jul. 5, 2023", W/ English Translation, 15 pgs.

"Taiwanese Application Serial No. 108140978, Response filed Oct. 2, 2023 to Office Action dated Jul. 5, 2023", w/ English claims, 25 pgs.

* cited by examiner

REGULATOR CIRCUIT PACKAGE TECHNIQUES

CROSS-REFERENCE TO RELATED APPLICATION

This application is a division of U.S. patent Application Ser. No. 16/193,843, filed Nov. 16, 2018, which is incorporated by reference herein in its entirety.

TECHNICAL FIELD

This application applies to techniques for heat dissipation and EMI containment of a switching regulator package.

BACKGROUND

Switching regulators, as the name applies, use high-frequency switching to generate a desired output voltage. Small current loops that are created at such high speeds can generate significant magnetic fields. If the switches are formed in an integrated circuit (IC), the current loops may occur entirely within the IC or partially internal and partially external to the IC. If a loop conducts an initial transient current due to the power switch closing or a synchronous rectifier switch closing, the relatively high di/dt results in a high magnetic field that may create electromagnetic interference (EMI).

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1A:
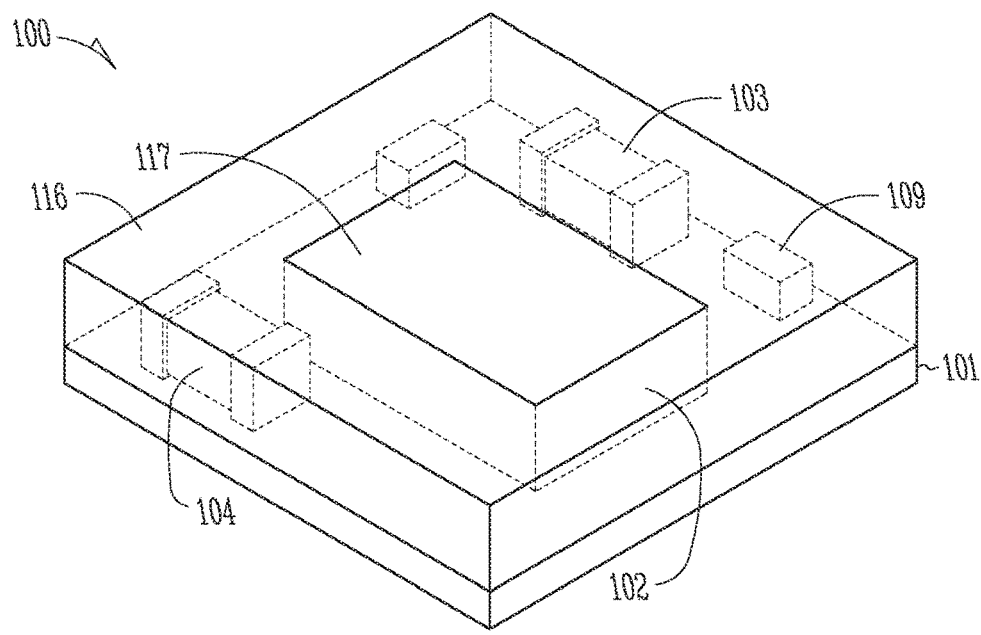
FIG. 1A illustrates generally a plan view of a switcher control package according to the present subject matter.

In a typical switching regulator, a pair of switches, a high side switch and a low side switch can conduct in alternating fashion to couple a voltage supply to an output terminal and alternately couple the output terminal to ground. In certain examples, such as for a buck regulator, an inductor may be coupled to output as part of an output circuit. In some examples, a controller can be connected to a gates of each switch of the high-side switch and the low-side switch. If the controller is a pulse-width modulation controller, the duty cycle of each switch can be controlled to provide a regulated voltage or regulated current. In certain examples, the duty cycle can be controlled in response to a comparison of a feedback voltage representative of the output voltage of the regulator and a reference voltage. In certain examples, one of the switches can be referred to as the power switch and the other as the synchronous rectifier, which can act as a low voltage drop diode. Typically, the pair of switches are not conducting at the same time to avoid a short circuit.

The regulator may be any type (e.g., buck, boost, flyback, etc), and the particular connection of the pair of switches to the inductor is determined by the type of regulator. The present subject matter may be employed in any type of switching regulator, and certain examples are given to illustrate the concepts of the subject matter as applied to a standard buck regulator switching configuration.

In certain regulators, a conventional bypass capacitor can be connected between the supply voltage and ground. Bypass capacitors are typically used in conventional switching circuits. The bypass capacitor can smooth transients when a switch of the pair of switches transitions between open and close. For example, when the regulator controller closes the high-side switch to charge the inductor, there can be a surge of current to charge parasitic capacitances. The current surge can be sourced by the charged bypass capacitor instead of directly form the supply. Sourcing the surge of current from the bypass capacitor cam help alleviate droop in the supply voltage caused by the surge of current and can smooth the switching transient. The bypass capacitor can form part of a current loop that can also include the pair of switches, the supply terminal, the ground terminal and the output of the regulator. Parasitic capacitances of the pair of switches can also be part of the current loop.

As discussed above and as an example, a very fast and high current pulse (having a large di/dt) can be generated at the switching frequency by the controller each time the high-side switch. This pulse, or hot current loop, can generate EMI, which may interfere with or create distortion in nearby electrical circuits. It is understood, that other high-energy pulses, and resulting magnetic fields and EMI can be generated at each transition of the pair of switches. The magnetic fields can emanate in all directions.

Recent advances have provided switching regulator techniques that generate a greatly reduced overall magnetic field, where the magnetic field is associated with quickly changing switch currents. Such techniques split the typical single current loop into multiple current loops, where the multiple current loops have linked opposing magnetic fields that cancel each other out, resulting in a much lower overall magnetic field and EMI compared to conventional designs. Such EMI reducing techniques are applicable to both planar and 3-dimensional (3-D) switching circuits in switch mode power supplies. Planar construction includes integrated circuits and printed circuit boards. 3-D construction includes stacked (vertically oriented) loop components, stacked integrated circuit elements, and stacked printed circuit boards. However, integrating the techniques on a device circuit board can compete with other layout techniques important for the device or functions thereof.

Figure 1B:
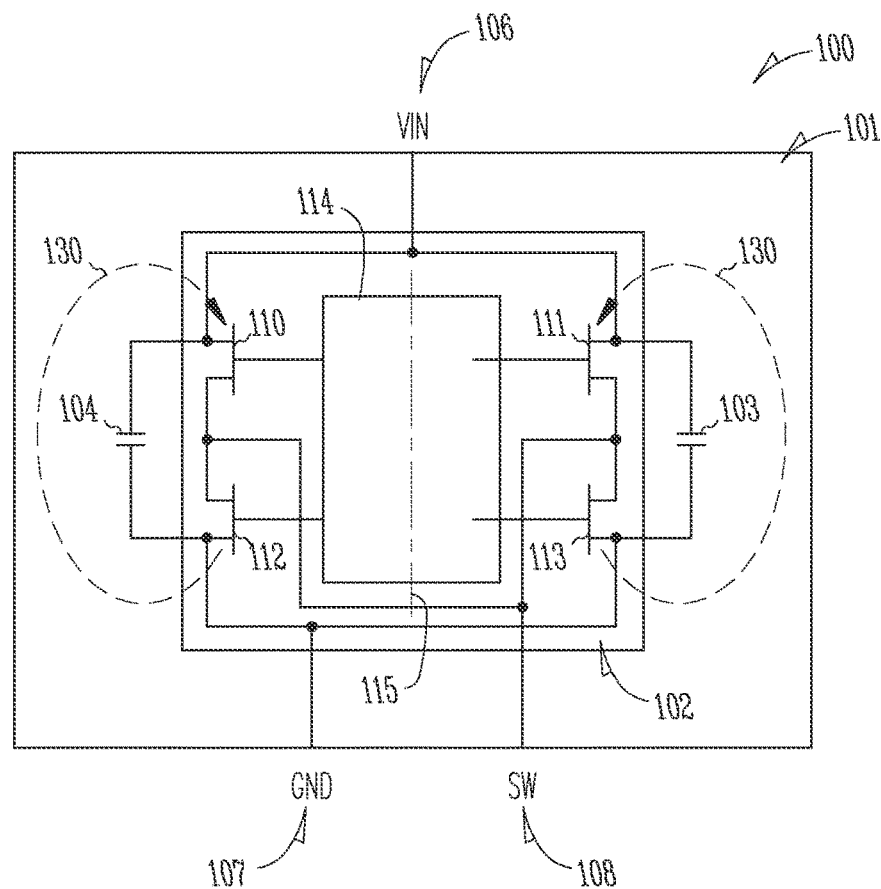
FIG. 1B illustrates generally a simplified example circuit diagram of the switcher control package of FIG. 1A.

The present inventors have recognized packaging techniques to provide EMI silent, or at least EMI quiet, switching packages. FIG. 1A illustrates generally a plan view of a switcher control package 100 according to the present subject matter. FIG. 1B illustrates generally a simplified example circuit diagram 120 of the switcher control package of FIG. 1A. The switcher control package 100 can include a substrate 101, controller integrated circuit (IC) 102, a pair of passive components such as switch capacitors 103, 104, a first supply input terminal 106, a second supply input terminal 107, and an output switch terminal (SW) 108. It is understood that the switcher control package 100 can also include other components, such as a bootstrap capacitor 109, without departing from the scope of the present subject matter. In certain examples, the substrate 101 can be a multiple layer laminate substrate. In certain examples, the substrate can support two metal or conductive layers. In certain examples, the controller IC can be a flip chip IC. In certain examples, the controller IC can include multiple power transistors 110, 111, 112, 113 for selectively coupling the first and second supply terminals with the output terminal. In certain examples, the controller IC 102 can include a thick substrate such that the height of the controller IC when mounted to the package substrate is higher than the height of the switch capacitors. In certain examples, the greater height of the controller IC 102 can allow an encapsulant 116 to completely cover all the components of the package except for a top surface 117 of the controller IC. The exposed surface of the controller IC can allow for increased thermal dissipation of the controller IC and the power transistors integrated with the controller IC over existing packaging solutions.

In certain examples, the exposed controller IC surface can accommodate a heat sink to further increase thermal dissipation. In some examples, the thick substrate of the controller IC can allow a dielectric encapsulant to be applied to a panel of packages and then the individual packages can be cut, or singulated, from the panel. Such application of the encapsulant can reduce the cost of the switching package. In certain examples, application of the encapsulant can also include a removal process, such as a milling or grinding process, to expose the surface of the controller IC.

In some examples, the panel of encapsulated packages can be further processed as a whole to add a shield, in contact, both mechanically and electrically, with the exposed surface of the controller IC, to form at least a portion of a top surface of the switching package. In certain examples, the shield can be conductive and can cover the controller IC die and the current loop paths 130 or interconnections of the switching package. Such coverage can provide a thermal heat sink to assist in dissipating heat of the switching package while also assisting to contain magnetic fields associated with the high di/dt switching of the switching package. Containing the magnetic fields associated with the current loop paths 130 can reduce EMI generated by the switching package. After application of the conductive shield to the panel of switching packages, the individual switching packages can be cut, or singulated, from the panel. Processing such a large number of packages at the same time can be much more economical than applying the conductive shield to individual parts.

In certain examples, the conductive shield can include one or more layers of electrical or thermal conductive material. In one example, the conductive shield can include a layer of copper between layers of stainless steel. In certain examples, the conductive shield can be applied using sputtering, an adhesive, chemical vaper deposition, etc. In some examples, sputtering can allow for fabrication of a very thin conductive shield such as on the order of a few micrometers.

Figure 2A:
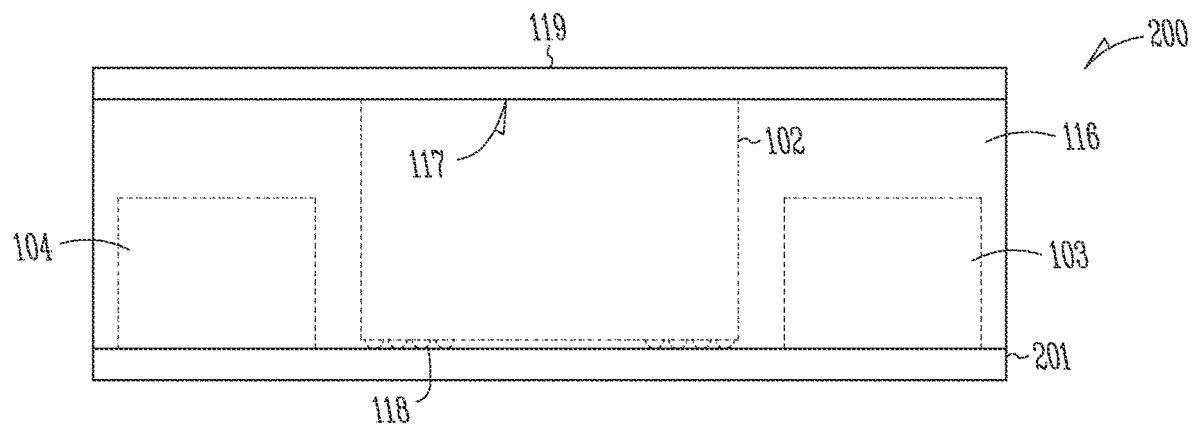
FIG. 2A illustrates general a cross section of an example switch control package.

FIG. 2A illustrates general a cross section of an example switch control package. The switcher control package can include a dielectric substrate, passive devices, one or more IC die, and an encapsulant covering the passive components and a majority of the one or more IC die but leaving at least a surface of at least on of the IC dies exposed. The surface can be opposite the substrate in certain examples. In certain examples, the dielectric substrate can include a multiple layer organic substrate. In some examples, the dielectric substrates include or supports two or more conductive layers. In some examples, the dielectric substrate can include mounting pads for the one or more IC die having for example, a micro-bump pitch as small as 50 um or less. In certain examples, an array of microbumps 118 of the IC die can be used to dissipate heat of the IC as well as provide electrical interconnection to the IC and other components of the package or to witch the package is connected.

In certain examples, the one or more IC die can include power transistors that operate in cooperation with the passive devices. In an example, the passive devices can be capacitors and can be arranged as discussed above to reduce EMI associated with high di/dt events when the power transistors transition states. In some examples, the IC die includes the power transistors and control logic for controlling the power transistors. In some examples, the power transistors can be in a separate IC die from an IC die including the control logic. Such an example may have a switch control package the includes gallium-based power transistors, or other semiconductor-based chips or devices, instead of silicon-based power transistors. In such examples, the power transistors IC can have a thick substrate bulk and the IC including the control logic may or may not include a thick substrate bulk. The exposed regions of the one more IC die can be used to dissipate heat. In certain examples, a heat sink can be coupled to the exposed region to assist in dissipating heat. In certain examples, dissipating heat via the exposed regions of the one or more IC die can free up room on the opposite side of the die that otherwise could be used for heat dissipation. Such additional room on the underside of the die can be used, for example, for more interconnects.

Figure 2B:
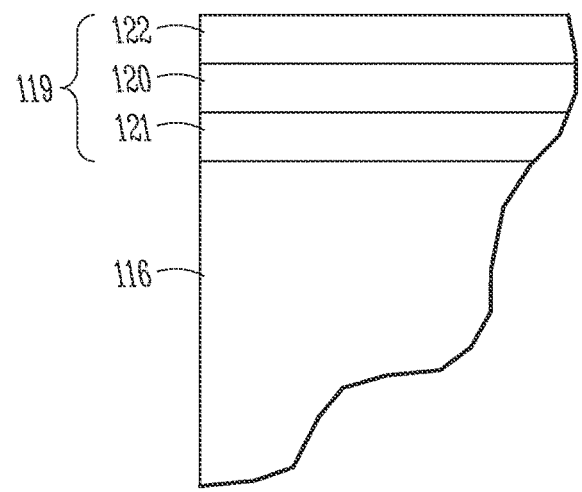
FIG. 2B illustrates generally a detail of an example conductive shield that may be deposited onto the encapsulant and exposed region of an IC of the switching package.

In certain examples, the switch control package can include an optional conductive shield 119. In certain examples, the conductive shield can assist with heat dissipation and may only cover the exposed region of one or more of the IC die. In some examples, the conductive shield extends beyond the exposed region of the die. For example, extending the conductive shield over the hot loop current paths and associated capacitors of the switch control package can significantly contain EMI generated by the switch control package. FIG. 2B illustrates generally a detail of an example conductive shield 119 that may be deposited onto the encapsulant 116 and exposed region of an IC of the switching package. In certain examples, the conductive shield can include one or more layers of material. In some examples, the conductive shield can include a conductive metal 120 such as copper. In some examples, the conductive metal layer 120 can be chemically insulated from the exposed surface of the die by a conductive barrier material 121 such as stainless steel, titanium, titanium nitride, etc. In certain examples, the conductive shield can include a second barrier material 122 to isolate a conductive layer from the ambient environment surrounding the switching package. In some examples, the shield can include a combination of conducting layers and insulating layers. Such insulating layers can include, but are not limited to, aluminum nitride, or alumina. In certain examples, the conductive shield can be applied using sputtering, an adhesive, chemical vaper deposition, etc. In some examples, sputtering can allow for fabrication of a very thin conductive shield such as on the order of a few micrometers.

Figure 3A:
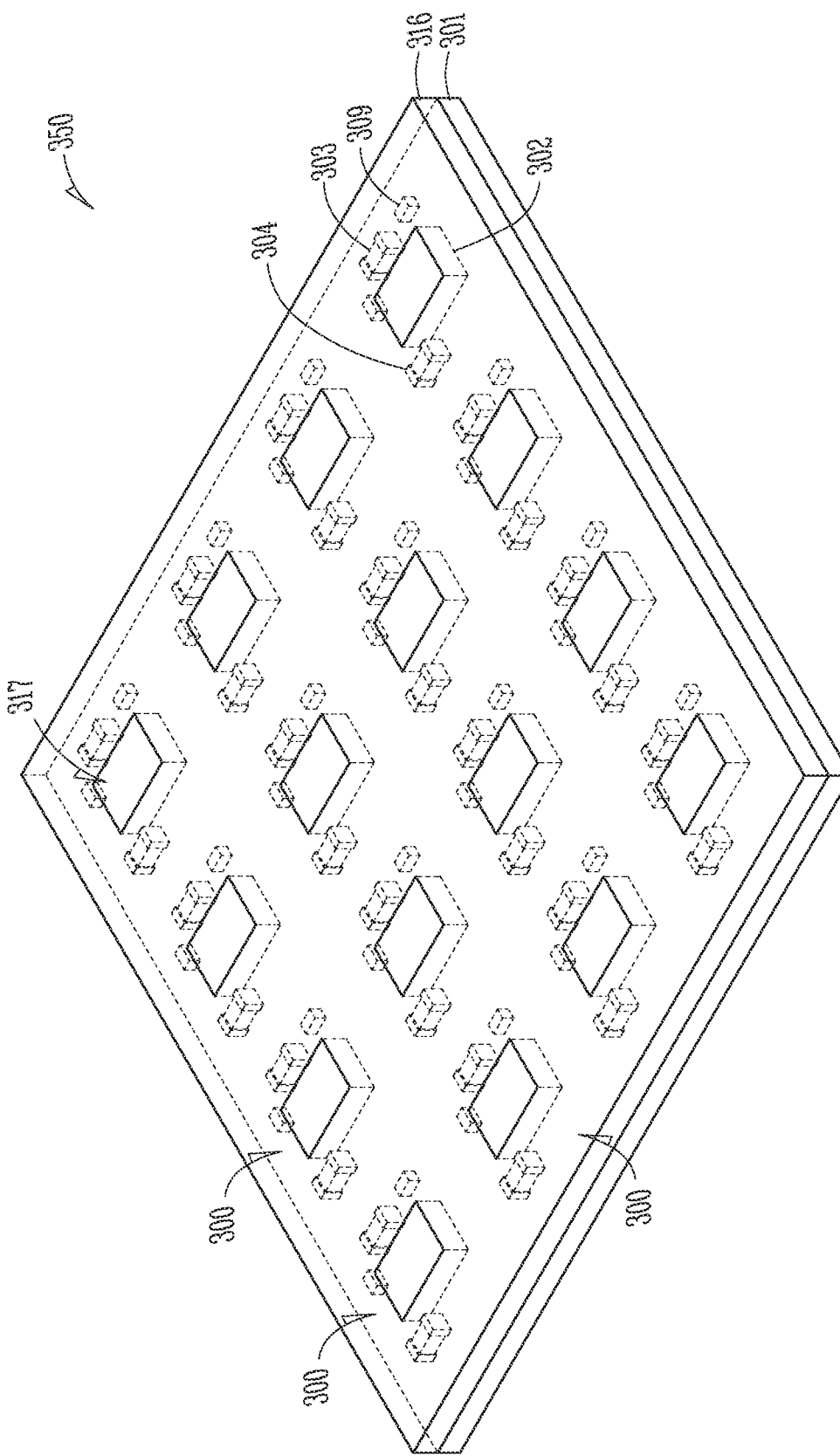
FIG. 3A illustrates generally an example panel of switching packages as they may appear in the fabrication process.

FIG. 3A illustrates generally an example panel 350 of switching packages 300 as they may appear in the fabrication process. As illustrated, the panel 350 of switching packages 300 can include a substrate 301, a plurality of passive components 303, 304, 309 mounted to the substrate 301 and an IC 302 or a plurality of ICs. The IC 302 can include the power transistor switches and control logic or circuitry for operating the switching package. One or more of the ICs 302 for each package can include a thick substrate. At least a portion of the passive components 303, 304 can define a layout with symmetry about one or more axes. Such symmetry can assist in attenuating EMI associated with high di/dt events of hot current loops of the switching package. In certain examples, encapsulant 316 can be applied to the entire panel 350 of switching packages to cover the passive components 303, 304, 309. In some examples, the encapsulant 316 can be applied to cover the passive components 303, 304, 309 and the ICs 302 of each switching package 300. In a follow-up operation, a removal process such as milling, grinding or etching can be used to planarize or otherwise expose the top surface 317 of one of the ICs 302 of each switching package 300. In certain examples, the panel 350 of switching packages can be cut or singulated to provide individual switching packages. In some examples, after the encapsulant 316 has been applied and processed to expose regions 317 of the ICs 302, a metal shield (not shown) can be applied to the panel 350 and then the individual switching packages 300 can be singulated from the panel 350.

Figure 3B:
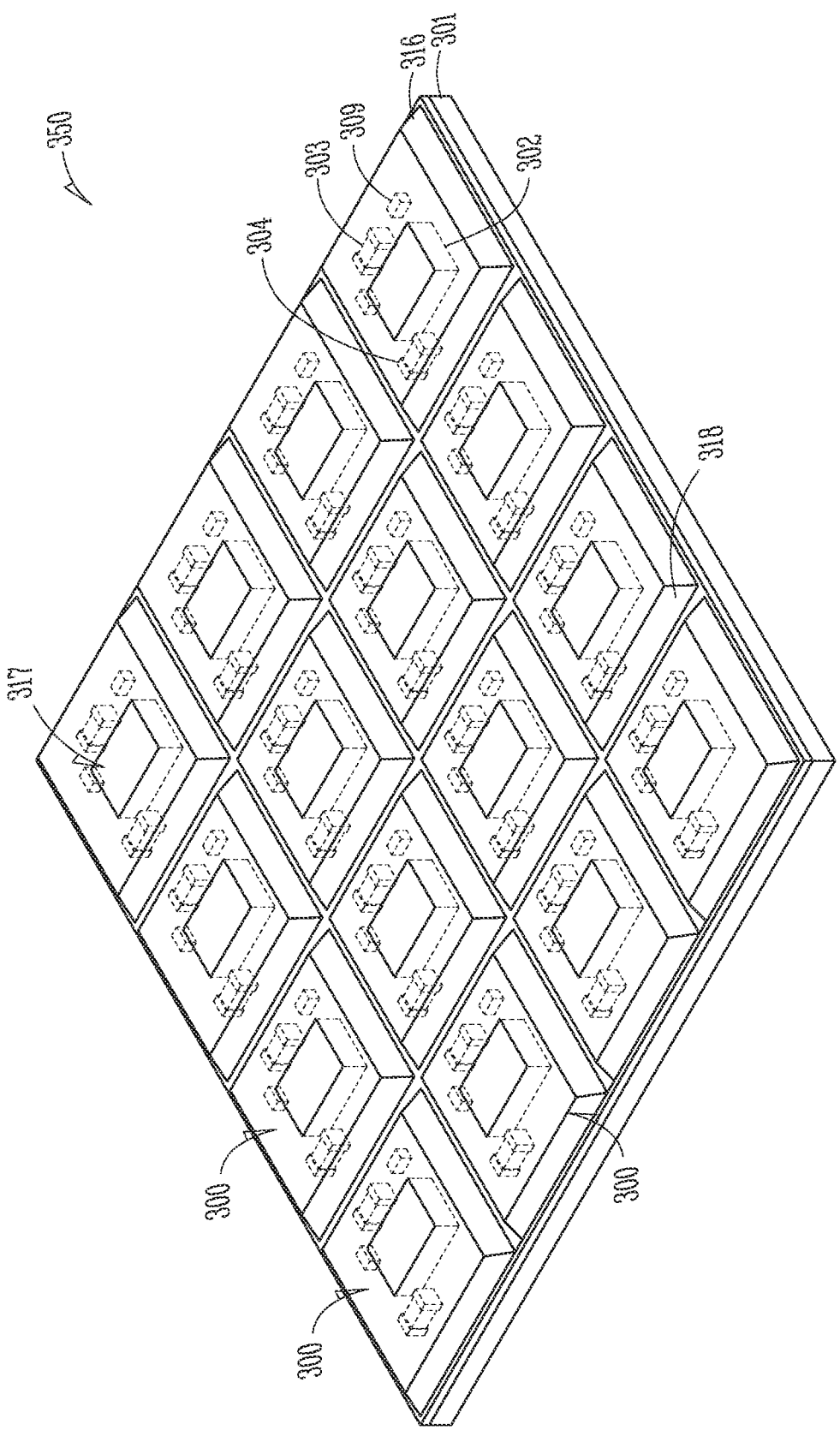
FIG. 3B illustrates generally an optional method of processing a panel of switching packages.
Figure 3C:
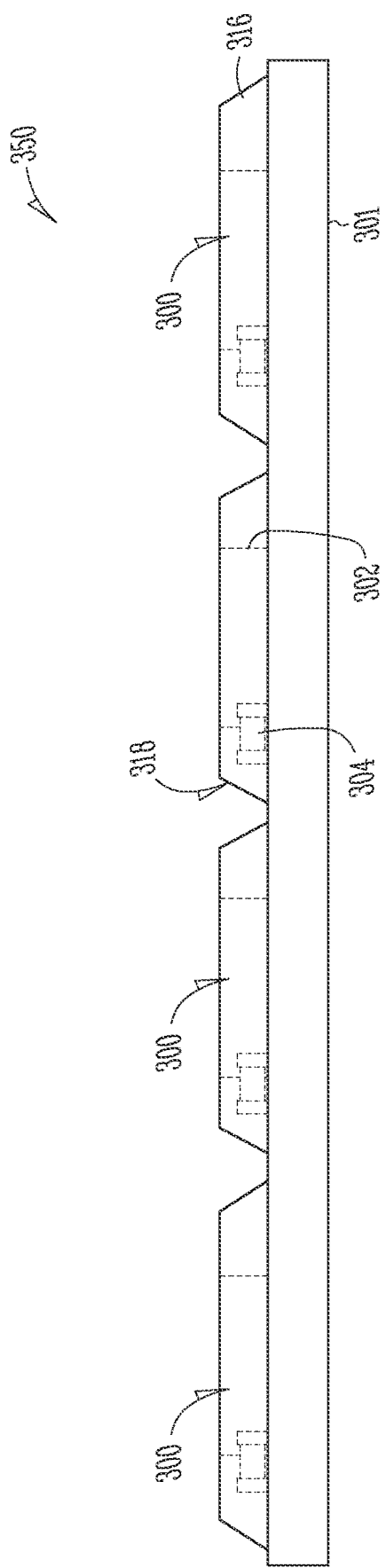
FIG. 3C illustrates a side view of the panel of FIG. 3B.

FIG. 3B illustrates generally an optional method of processing a panel 350 of switching packages 300. FIG. 3C illustrates a side view of the panel of FIG. 3B. In some examples, after the encapsulant 316 has been applied and processed to expose regions 317 of the ICs 302, a first cutting or routing operation can proceed such that the operation does not sever the packages 300 but exposes at least a portion of a sidewall 318 of each package 300. A metal shield as described above can then be deposited on the panel 350 such that not only the top surface of each package 300 is covered by the shield, but also, at least a portion of one or more sidewalls 318 of each package 300 is covered by the shield. Upon application of the metal shield to the panel 350, the individual switching packages 300 can then be singulated.

Figure 4:
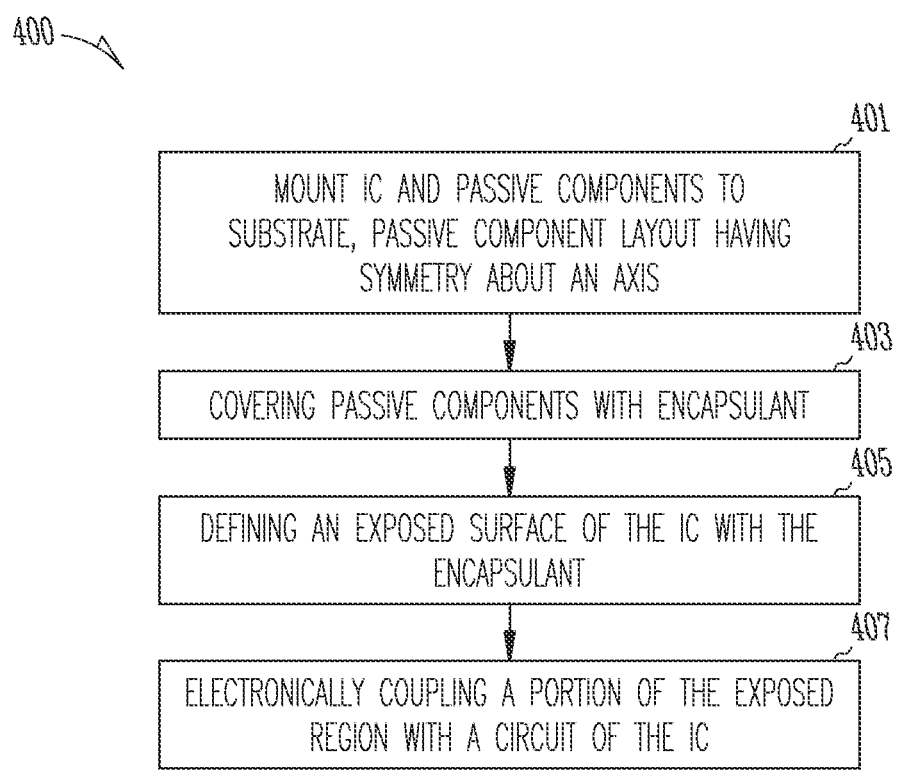
FIG. 4 illustrates generally an example method for fabricating a low noise or silent switcher integrated circuit package.

FIG. 4 illustrates generally an example method 400 for fabricating a low noise or silent switcher integrated circuit package. At 401, an IC die and passive components can be mounted to a substrate. In certain examples, some of the passive components can be associated with current loops that can emit substantial electromagnetic interference. Such passive components can be arranged on the substrate with symmetry along at least one axis. Such symmetry can allow the magnetic fields of a current loop associated with one passive component to cancel at least a portion of the magnetic field of a current loop associated with a symmetrically layout passive component and vice versa.

At 403, the passive components can be covered with an encapsulant such as a dielectric. The encapsulant can create an attractive IC package and can physically protect the components mounted to the substrate. At 405, either as the encapsulant is applied to the substrate or via some other process, such as milling, grinding, etching etc., a region of the IC die can be exposed. In certain examples, the exposed region is a top-side of the IC die that is opposite the substrate. At 407, the exposed region of the IC die can be electrically coupled to a circuit of the IC die. In some examples, the exposed region of the IC die is electrically coupled to a ground of the circuit of the IC die.

In certain examples, a heat sink can be placed in contact with the exposed region of the IC die to allow for additional heat dissipation capacity of the IC package. For example, in certain examples, the IC die can include power switching transistor to provide a switching IC package for a voltage or power converter. By exposing a region of the IC die, and attaching a heat sink to the exposed surface, or allowing a heat sink to contact the exposed region, can allow the switching package to be used with higher power converters. In some examples, dissipating heat through an exposed region of the die opposite the external connections of the switching IC package can allow the same size power switching transistors to be used in converters configured to deliver X times more power compared to similarly structured switching packages without the exposed region of the IC die. In certain examples, the exposed region can accommodate a metallic shield that can function as a heat sink and also as a containment barrier to mitigate EMI generated by the current loops associated with the switching components of the switching IC package.

Figure 5:
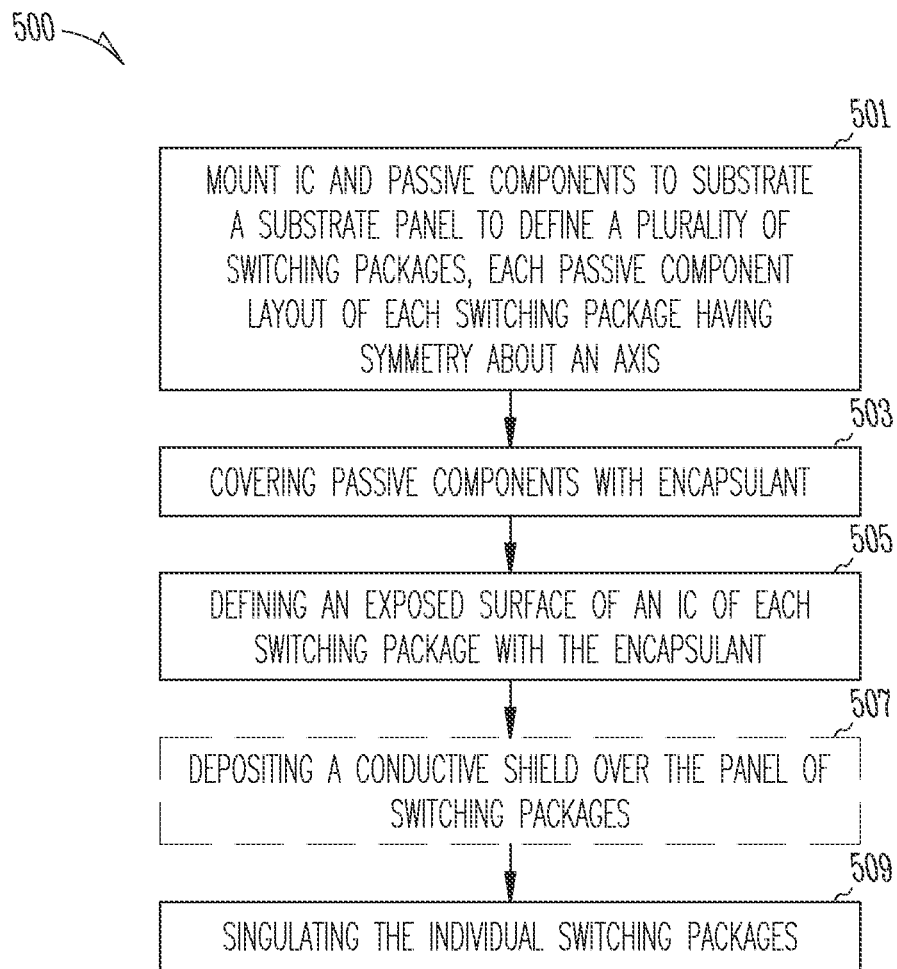
FIG. 5 illustrates generally a flowchart of an example method for more efficiently fabricating high volumes of a quiet or silent switcher IC package.

FIG. 5 illustrates generally a flowchart of an example method 500 for more efficiently fabricating high volumes of a quiet or silent switcher IC package. At 501, IC dies and passive components can be mounted to substrate of a substrate panel to define a plurality of IC switching packages. In certain examples, some of the passive components can be associated with current loops that can emit substantial electromagnetic interference. Such passive components can be arranged on the substrate with symmetry along at least one axis of each IC switching package. Such symmetry can allow the magnetic fields of a current loop associated with one passive component to cancel at least a portion of the magnetic field of a current loop associated with a symmetrically layout passive component and vice versa. In certain examples, the mounting of the components to the substrate may be mounted to individual package substrates and the partially fabricated packages can be arranged to form a panel.

At 503, an encapsulant can be fabricated over the panel to cover the passive components. At 505, either as the encapsulant is applied to the panel or via some other process, such as milling, grinding, etching, etc., a region of each IC die can be exposed. In certain examples, the exposed region is a top-side of the IC die that is opposite the substrate. In certain examples, the exposed region of the IC die can be electrically coupled to a circuit of the IC die. In some examples, the exposed region of the IC die is electrically coupled to a ground of the circuit of the IC die.

At 507, an optional metallic or conductive shield can be applied to the exposed regions of each die of the panel of packages. In certain examples, the conductive shield can be deposited on the entire top surface of the panel which can be very efficient and can ensure that the shield for each IC switching package covers the entire top surface of the IC switching package. In certain examples, the conductive shield can be applied via the methods described above with respect to FIGS. 1, 2A and 2B. At 509, whether the shield is added or not, the panel can be singulated, or cut, to provide multiple individual IC switching packages. In certain examples, the IC switching package can be referred to as a power converter control package.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein. In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, the terms "including" and "comprising" are open-ended, that is, a system, device, article, composition, formulation, or process that includes elements in addition to those listed after such a term are still deemed to fall within the scope of subject matter discussed. Moreover, such as may appear in a claim, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of a claim. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. The following aspects are hereby incorporated into the Detailed Description as examples or embodiments, with each aspect standing on its own as a separate embodiment, and it is contemplated that such embodiments can be combined with each other in various combinations or permutations.

What is claimed is:

1. A method of forming a power converter control circuit package, the method comprising:
    mounting an integrated circuit die and at least two passive devices on a substrate, the substrate supporting at least two conductive layers, and wherein a layout defined by locations of the at least two passive devices and electrical interconnections of the two passive devices provided by the substrate to the integrated circuit die are substantially symmetric about at least one axis;
    covering an entirety of the at least two passive devices with an encapsulant to provide a panel of encapsulated power converter control packages;
    defining an exposed region of the integrated circuit die with the encapsulant; and
    electrically coupling at least a portion of the exposed region with a circuit defined by the integrated circuit die.

2. The method of claim 1, further including forming a heat sink onto the exposed region of the integrated circuit die.

3. The method of claim 1, further including depositing a shield on the exposed region of the integrated circuit die.

4. The method of claim 3, wherein depositing the shield on the exposed region of the integrated circuit die includes depositing alternating layers of stainless steel and copper on the exposed region of the integrated circuit die.

5. The method of claim 1, wherein the covering an entirety of the at least two passive devices with an encapsulant includes covering an entirety of the at least two passive devices of a panel of power converter control packages; and
    wherein the defining an exposed region of the integrated circuit die with the encapsulant includes defining a plurality of exposed regions of a plurality of IC die of the panel of encapsulated power converter control packages.

6. The method of claim 5, further including singulating individual power converter control packages from the panel of power converter control packages.

7. The method of claim 5, wherein the covering an entirety of the at least two passive devices with an encapsulant includes depositing a shield over the panel of encapsulated power converter control packages with the plurality of exposed regions; and
    singulating individual power converter control packages from the panel of power converter control packages.

8. The method gf claim 1, wherein the at least two passive devices include a first capacitor and a second capacitor.

9. The method of claim 8, further comprising:
    coupling a plurality of transistors with one or more of the first capacitor, the second capacitor, or an output terminal of the IC package.

10. The method of claim 9, further comprising:
    defining a layout by locations of the plurality of transistors are substantially symmetric about the at least one axis.

11. The method of claim 9, further comprising:
    providing control logic in the IC die configured to control a control gate of each transistor of the plurality of transistors.

12. A method of manufacturing a control circuit package, the method comprising:
- providing a substrate;
- mounting a pair of devices on a surface of the substrate in symmetry along an axis;
- mounting an integrated circuit (IC) die on the surface of the substrate; and
- covering the pair of devices with an encapsulant, wherein a region of the IC die is exposed outside of the encapsulant; and
- disposing a circuit in the IC die, wherein the region of the IC die is electrically coupled to a ground connection of the circuit.

13. The method of claim 12, wherein the region is a top surface of the IC die.

14. The method of claim 12, further comprising:
- providing a plurality of transistors in the IC die, the plurality of transistors arranged in symmetry along the axis.

15. The method of claim 12, further comprising:
- forming a heat sink onto the exposed region of the IC die.

16. The method of claim 12, further comprising:
- depositing a shield on the exposed region of the IC die.

17. The method of claim 16, wherein depositing the shield on the exposed region of the IC die includes depositing alternating layers of stainless steel and copper on the exposed region of the IC die.

18. The method of claim 12, wherein the covering the pair of devices with the encapsulant includes covering the pair of devices of a panel of power converter control packages; and
- wherein the exposed region includes defining a plurality of exposed regions of a plurality of IC die of the panel of encapsulated power converter control packages.

19. The method of claim 18, including singulating individual power converter control packages from the panel of power converter control packages.

* * * * *